United States Patent [19]

Nishimura

[11] Patent Number: 4,721,365

[45] Date of Patent: Jan. 26, 1988

[54] ELECTRONIC DEVICE INCLUDING PANELS WITH ELECTRICAL ALIGNMENT MEANS

[75] Inventor: Norihisa Nishimura, Tokyo, Japan

[73] Assignee: Canon Kabushiki Kaisha, Tokyo, Japan

[21] Appl. No.: 799,096

[22] Filed: Nov. 18, 1985

[30] Foreign Application Priority Data

Nov. 21, 1984 [JP] Japan ................................ 59-244364

[51] Int. Cl.⁴ ............................................. G02F 1/133
[52] U.S. Cl. ..................................... 350/336; 29/593; 33/613; 33/614; 340/870.37; 350/331 R
[58] Field of Search ........................... 33/180 R, 184.5; 350/334, 336, 331 R; 340/870.37; 339/59 M; 29/593

[56] References Cited

U.S. PATENT DOCUMENTS

| | | | |
|---|---|---|---|
| 3,783,520 | 1/1974 | King | 33/180 R |
| 3,883,213 | 5/1975 | Glaister | 350/334 |
| 4,199,637 | 4/1980 | Sado | 339/59 M |
| 4,356,223 | 10/1982 | Iida et al. | 33/180 R |
| 4,544,238 | 10/1985 | Nickol | 350/336 |
| 4,545,647 | 10/1985 | Sasaki et al. | 350/336 |
| 4,566,193 | 1/1986 | Hackleman et al. | 33/180 R |

*Primary Examiner*—John K. Corbin
*Assistant Examiner*—Martin Lerner
*Attorney, Agent, or Firm*—Fitzpatrick, Cella, Harper & Scinto

[57] ABSTRACT

An electronic device, includes a first panel on which a plurality of first terminals are disposed at a pitch in parallel with each other, a second panel on which a plurality of second terminals are disposed in parallel with each other and at substantially the same pitch as that for the first terminals, and a pair of dummy electrodes respectively disposed on the first and the second panel. The pair of dummy electrodes have widths which are smaller than the widths of and the spacings between the first and second terminals, respectively, and are disposed in such a manner that they are electrically connected to each other when the first and second terminals are disposed at the right positions in alignment with each other.

11 Claims, 8 Drawing Figures

ELECTRONIC DEVICE INCLUDING PANELS WITH ELECTRICAL ALIGNMENT MEANS

FIELD OF THE INVENTION AND RELATED ART

The present invention relates to an electronic device such as a liquid crystal panel, and more particularly, relates to an electronic device wherein the alignment of members or the alignment connection of terminals is ensured by utilizing electrical continuity.

At present, electrical connection between lead conductors or wires and external conductors or wires formed on a pair of substrates may frequently be effected by disposing an anisotropic conductive rubber connector between the terminals therefor. In this instance, the lead conductors or terminals to be connected have hitherto been those having widths of about 200 $\mu$m or more and arranged at a pitch of 400 $\mu$m or above, and it has been possible to effect the alignment between the pair of substrates by naked eye observation or mechanical abutting through the use of a part of an apparatus.

However, as there is recently increasing demand for a large area and a high element density of a matrix-type display panel, particularly a matrix-type liquid crystal display panel having a matrix substrate integrally provided with a driving semiconductor array, terminal conductors are required to be about 100 $\mu$m or less in width and arranged at a pitch of 200 $\mu$m or less. For producing such panels, it is impossible to effect alignment by naked eye observation or mechanical abutting and an optical apparatus for alignment is used. Even with the use of such an optical alignment apparatus, however, a short circuit and/or deviation of pitch between adjacent terminals can occur.

SUMMARY OF THE INVENTION

A principal object of the present invention is, in view of the problems as described above, to provide an electronic device, particularly a display panel with improved quality through improved connection with an external driving unit and with decrease in defective connections.

According to the present invention, there is provided an electronis device comprising: a first panel on which a plurality of first terminals are disposed at a pitch in parallel with each other, a second panel on which a plurality of second terminals are disposed in parallel with each other and at substantially the same pitch as that for the first terminal, and a pair of dummy electrodes respectively disposed on the first and second panel; the pair of dummy electrodes having widths which are smaller than the widths of or the spacings between the first and second terminals, respectively, and being disposed in such a manner that they are electrically connected to each other when the first and second terminals are disposed in alignment with each other.

The widths of the dummy electrodes are preferably 10-90%, e.g. 10-90 $\mu$, of the widths (or the spacings, if the spacings are smaller than the widths), e.g., about 100 $\mu$ or so, of the terminals. The accuracy of the alignment is increased as the widths of the dummy electrodes decrease.

According to another aspect of the present invention there is provided an electronic device comprising: a first substrate on which a dummy electrode is formed, and a second substrate on which a plurality of dummy electrodes are formed in such a manner that the plurality of dummy electrodes on the second substrate electrically contact the dummy electrode on the first substrate when the first and second substrates are superposed in alignment with each other.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 7 and 8 are plan views showing connection states corresponding to the fifth embodiment shown in FIG. 6, of which FIG. 7 shows a normal connection state, and FIG. 8 shows an abnormal connection state.

DETAILED DESCRIPTION OF PREFERRED EMBODIMENTS

Figure 1:
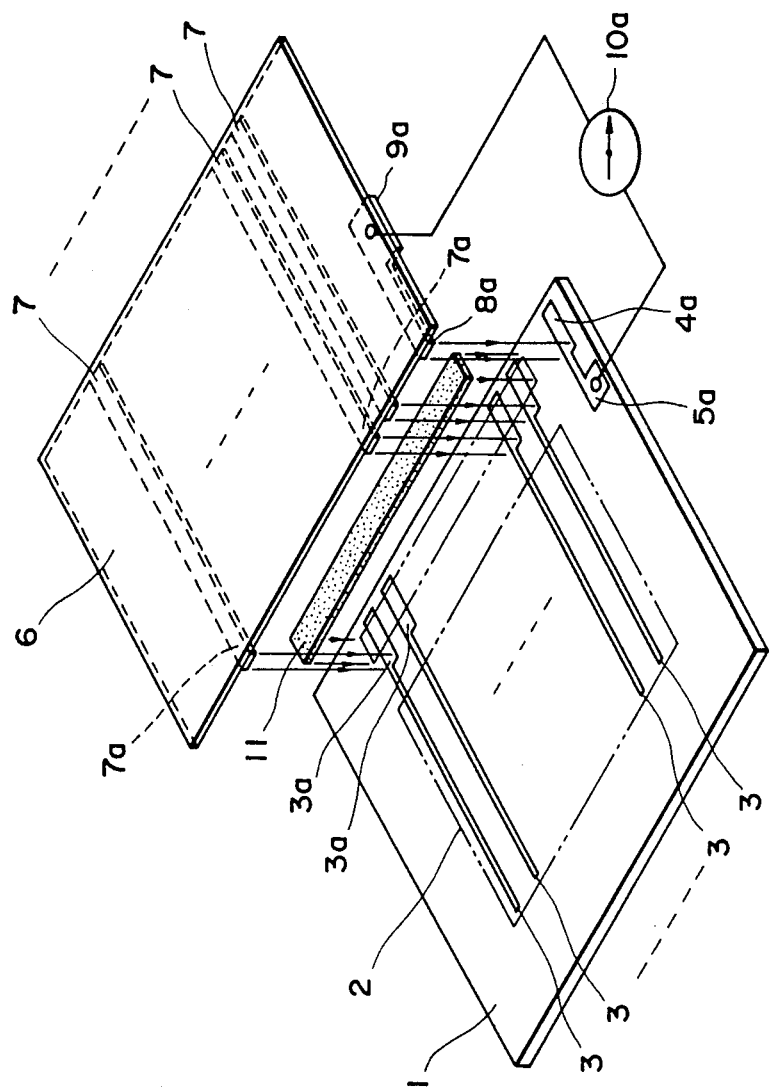
FIG. 1 is a perspective view showing a basic concept of the present invention.

FIG. 1 is a view showing a basic concept of the invention. Referring to FIG. 1, on a display panel 1 is defined a display zone or unit 2. Lead conductors 3 are arranged at an appropriate pitch on the display panel 3, and terminals 3a are respectively connected to the lead conductors 3. A display panel side dummy electrode 4a is formed at a position close to an edge of the display panel and is provided with an electrode pad 5a connected thereto. Correspondingly, on a driver side panel disposed to be connected with the display panel 1, there are provided lead conductors 7 which are electrically connected through terminals 7a with the lead conductors 3 on the display panel 1. A driver side dummy electrode 8a provided with a pad 9a is also disposed at a part close to an edge of the driven side display panel 6 in correspondence with the display panel side dummy electrode. The two dummy electrodes 4a and 8a are formed at the corresponding positions on the panels 1 and 6, respectively, with line widths smaller than the widths of and the spacings between the lead conductor terminals 3a and 7a, respectively. The panels 1 and 6 are connected with each other through a connector 11 composed of a heat sealable conductor or an anisotropically conductive rubber and the alignment therebetween is ensured by an electrical continuity detector 10a.

A manner of connecting the two panels while ensuring the alignment therebetween is explained hereinbelow.

Positional alignment is first effected by using the dummy electrodes 4a and 8a disposed to have widths which are respectively less than the widths or spacings of the condcutor terminals 3a and 7a, respectively, as alignment marks; and then by using the continuity detector 10a connected to the dummy electrode pads 5a and 9a. Finally the upper and lower substrates or panels are connected with each other so that the terminals 3 and 7 are electrically connected with each other separately or collectively. In this instance, the substrates may be connected by using a connector as described or by bonding directly respective terminals without using such a connector.

Figure 2:
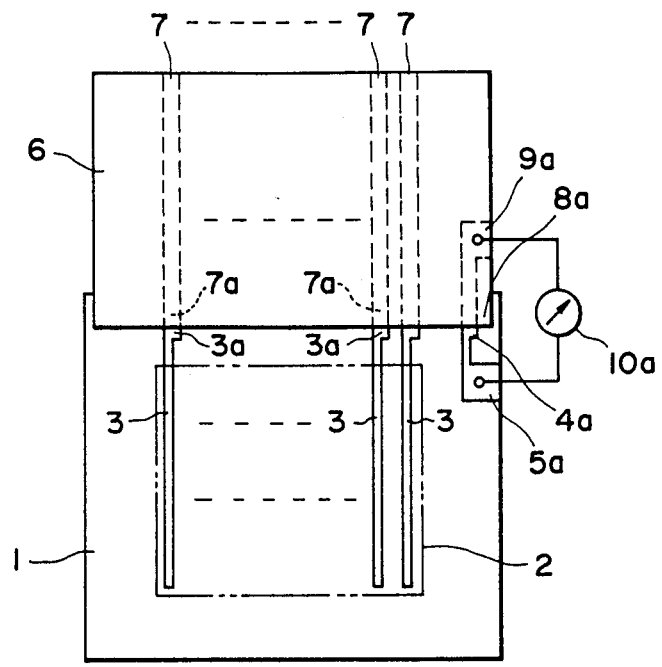
FIGS. 2, 3, 4 and 5 are plan views showing a first, a second, a third and a fourth embodiment, respectively, of the present invention.

FIG. 2 is a plan view corresponding to FIG. 1 and shows a first embodiment according to the present invention. This embodiment is a most basic one wherein a pair of dummy electrodes and a continuity detector are disposed on one side of the panels.

Figure 3:
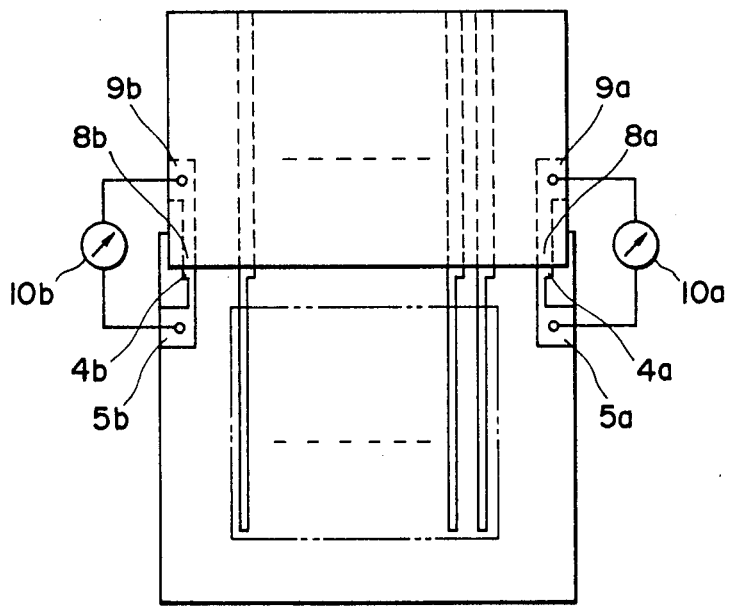

FIG. 3 is a plan view showing a second embodiment of the present invention, wherein an additional pair of dummy electrodes 4b and 8b and an additional continuity detector are disposed symmetrically with those in the fitst embodiment so as to ensure the alignment and connection in the direction perpendicular to the extension of the lead connectors 3a and 7a.

Figure 4:
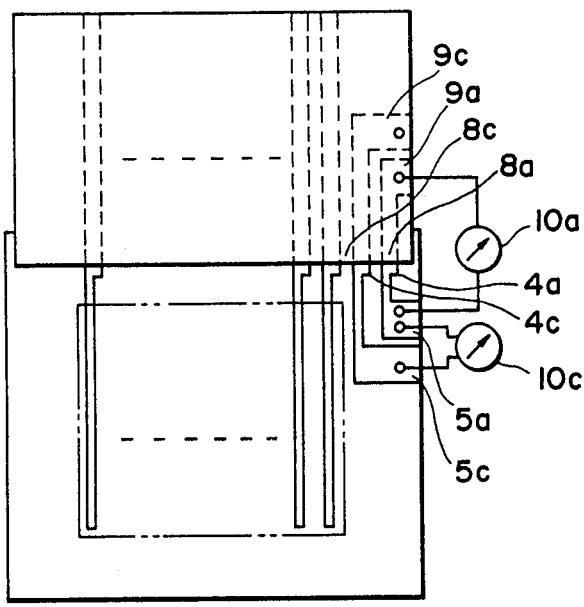

FIG. 4 shows a third embodiment, wherein a pair of dummy electrodes 4c and 8c having widths smaller than the widths of or spacings between the lead wires 3 and 7, respectively, and dummy electrode pads 5c and 9c connected thereto are added to the first embodiment shown in FIG. 2, and continuity detectors 10a and 10c are provided between dummy electrode pads 5a and 5c and between pads 5a and 9a, so as to detect any short circuits caused between lead conductors or terminals thereof along the direction of the arrangement of these and also any short circuits caused between the conductors or terminals due to distortion of the panel 1 or 6.

Figure 5:
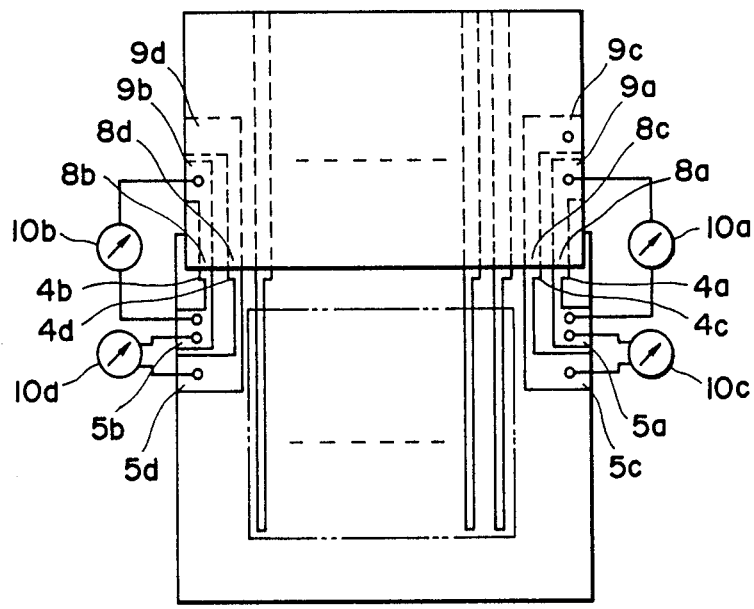

FIG. 5 shows a fourth embodiment, wherein additional dummy electrodes 4b, 8b, 4d and 8d, dummy electrode pads 5b, 9b, 5d and 9d, and continuity detectors 10b and 10d are disposed between the pads 5b and 9b and between 5d and 9d, so as to further improve the connection quality.

The above embodiments have been explained as those concerned with display devices but may also be equally applicable to other devices requiring alignment connection between substrates. Another application of the present invention will now be described with reference to FIGS. 6 through 8.

Figure 6:
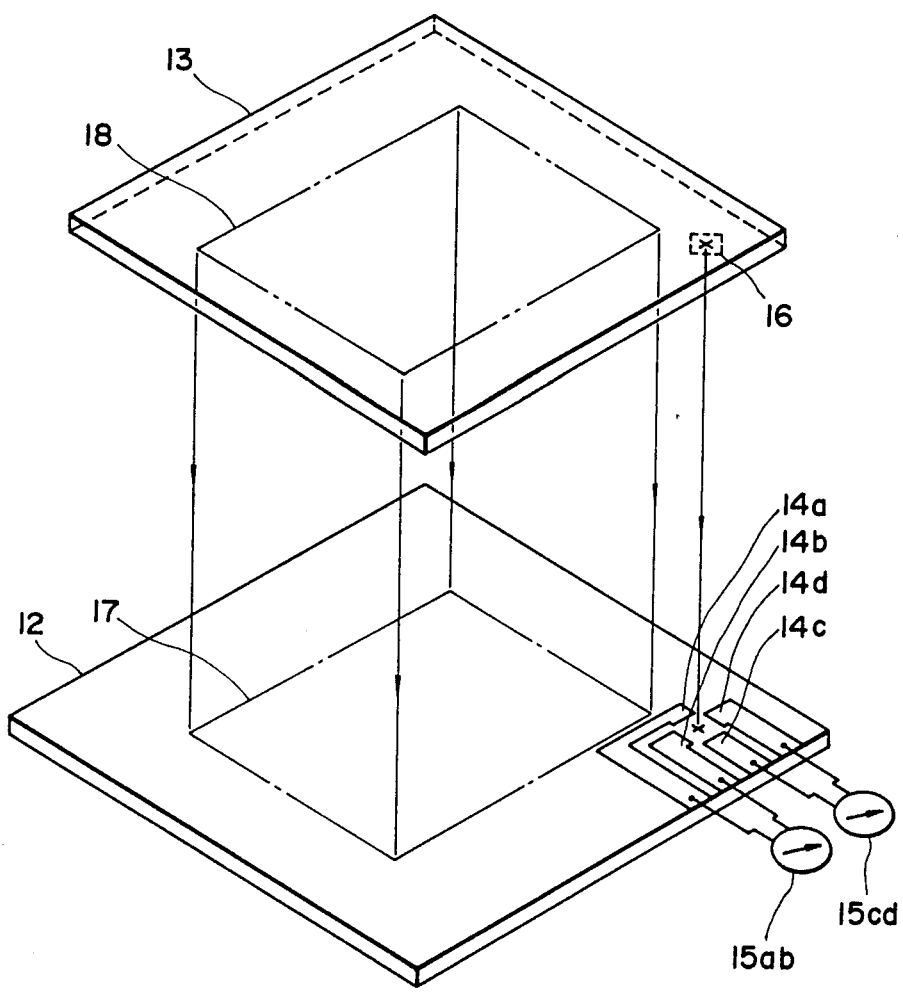
FIG. 6 is a perspective view showing a fifth embodiment of the present invention.
Figure 7:
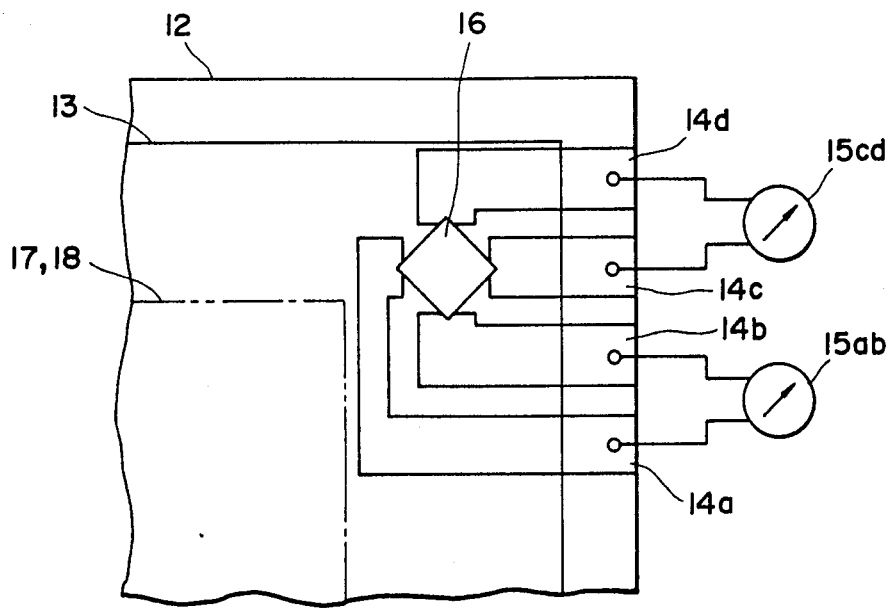
Figure 8:
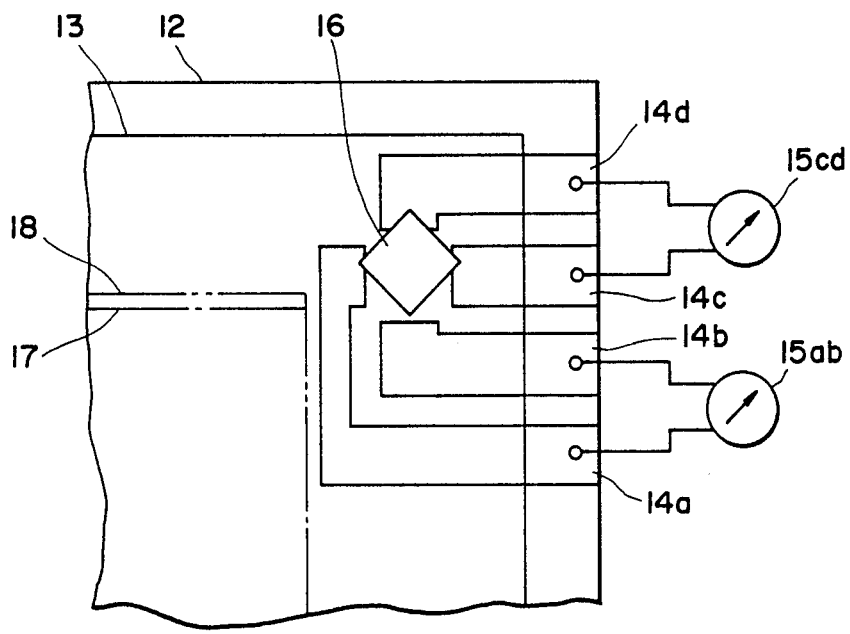

FIG. 6 is a perspective view showing a fifth embodiment of the present invention, and FIGS. 7 and 8 are corresponding partial plan views showing enlarged views in the neighborhood of the dummy electrodes, of which FIG. 7 shows a normal connection state and FIG. 8 shows an abnormal connection state. Referring to FIG. 6, a lower substrate 12 and an upper substrate 13 are to be connected in alignment with each other. Alignment electrodes 14a, 14b, 14c and 14d are formed at a marginal part on the lower substrate 12. The alignment electrodes 14a and 14b are electrically connected with each other through a continuity detector 15ab, and the alignment electrodes 14c and 14d are connected with each other through a continuity detector 15cd. An alignment basis pattern 16 made of a conductive material is formed on the substrate 13. Zones or areas 17 and 18 to be aligned with each other are defined on the opposite faces of the lower and upper substrates 12 and 13, respectively.

A liquid crystal (not shown) may be disposed between the lower and upper substrate 12 and 13 to provide a liquid crystal display panel, wherein a driving semiconductor array is integrally disposed on either one of the substrates 12 and 13 to form an active matrix substrate.

In the above arrangement, when the alignment pattern 16 on the upper substrate 13 contacts all of the alignment electrodes 14a, 14b, 14c and 14d on the lower substrate 2 as shown in FIG. 7, the continuity detectors 15ab and 15cd indicate the conduction state so that the alignment is ensured. On the other hand, when the alignment basis pattern 16 does not contact all of the alignment electrodes 14a, 14b, 14c and 14d, the continiuty detectors 15ab and 15cd indicates noncontinuity so that the substrates 12 and 13 are judged to be not in a proper alignment.

In the above description with reference to FIGS. 6 to 8, an embodiment having one set of alignment electrodes with one alignment basis pattern, whereas a plurality of such alignment sets may be used to effect a more accurate positional alignment.

As will be understood from the above description, the present invention includes a process for ensuring positional alignment between a pair of substrates, wherein at least one pair of dummy electrodes are distributed to the pair of substrates, disposed thereon and respectively connected to an electrode pad for checking electrical continuity, and an electrical continuity checking means is disposed so as to electrically ensure the positional alignment between the substrates. Particularly, in the present invention, an alignment electrode and an alignment basis pattern are respectively disposed on a pair of substrates to be positionally aligned with each other, and a continuity detector is externally provided to electrically check the positional alignment between the substrates, whereby fine alignment can be effected simply and easily. Therefore, compared with the conventional system, the number of poor connection are remarkably decreased and improvement in quality is also ensured.

What is claimed is:

1. An electronic device comprising a first panel on which a plurality of first terminals are disposed at a pitch in parallel with each other, a second panel on which a plurality of second terminals are disposed in parallel with each other and at substantially the same pitch as that for the first terminals, and a pair of dummy electrodes respectively disposed on the first and the second panel; said pair of dummy electrodes having widths which are smaller than the widths of or the spacings between the first and second terminals, respectively, and being disposed in such a manner that said pair of dummy electrodes are electrically connected to each other when the first and second terminals are disposed in alignment with each other before the first and second panels are secured to each other.

2. The electronic device according to claim 1, wherein said first panel comprises a liquid crystal display unit, and a second panel comprises a driving circuit for the display unit.

3. The electronic device according to claim 1, wherein said first and second terminals are connected to each other through an anisotropic conductive member.

4. The electronic device according to claim 3, wherein said anisotropic conductive member is an ansitropic rubber connector.

5. The electronic device according to claim 1, wherein said dummy electrodes are provided in a plurality of pairs and distributed to and disposed on the first and second panels, respectively.

6. The electronic device according to claim 2, wherein said liquid crystal display unit is constituted by a matrix-type liquid crystal display panel comprising a matrix substrate integrally provided with a driving semiconductor array.

7. An electronic device comprising a first substrate on which a dummy electrode is formed, and a second substrate on which a plurality of dummy electrodes are formed in such a manner that said plurality of dummy electrodes on the second substrate surround and electrically contact the dummy electrode on the first substrate when the first and second substrates are superposed in alignment with each other before the first and second substrates are secured to each other.

8. The electronic device according to claim 7, which comprises a liquid crystal disposed between the first and second substrates.

9. The electronic device according to claim 7, either one of the first and second substrates is integrally provided with a driving semiconductor array.

10. The electronic device according to claim 7, wherein said first substrate has a quadrilateral dummy electrode, and said second substrate has four dummy electrodes disposed to respectively contact one apex of the quadrilateral dummy electrode.

11. The electronic device according to claim 7, wherein said dummy electrode is disposed in an electrically isolated form on the first substrate.

* * * * *

UNITED STATES PATENT AND TRADEMARK OFFICE
CERTIFICATE OF CORRECTION

PATENT NO. : 4,721,365

DATED : January 26, 1988

INVENTOR(S) : N. NISHIMURA

It is certified that error appears in the above-identified patent and that said Letters Patent is hereby corrected as shown below:

On the Tilte Page

AT [57] IN THE ABSTRACT

Line 1, "device," should read --device--.

COLUMN 1

Line 45, "electronis" should read --electronic--.

COLUMN 2

Line 31, "panel 3," should read --panel 1,--.
    Line 42, "part" should read --position--.
    Line 50, "heat sealable" should read
          --heat-sealable--.
    Line 60, "condcutor" should read --conductor--.

COLUMN 3

Line 12, "fitst" should read --first--.
    Line 48, "part" should read --position--.
    Line 59, "substrate" should read --substrates--.
    Line 67, "substrate 2" should read --substrate 12--.

UNITED STATES PATENT AND TRADEMARK OFFICE
CERTIFICATE OF CORRECTION

PATENT NO. : 4,721,365

DATED : January 26, 1988

INVENTOR(S) : N. NISHIMURA

It is certified that error appears in the above-identified patent and that said Letters Patent is hereby corrected as shown below:

COLUMN 4

Line 4, "indicates" should read --indicate--.
    Line 28, "connection" should read --connections--.
    Line 49, "a second" should read --said second--.
    Line 55, "ansi" should read --anis---.

COLUMN 6

Line 1, "either" should read --wherein either--.

Signed and Sealed this

Ninth Day of August, 1988

Attest:

DONALD J. QUIGG

*Attesting Officer*    *Commissioner of Patents and Trademarks*